(12) United States Patent
Lee

(10) Patent No.: US 7,977,577 B2
(45) Date of Patent: Jul. 12, 2011

(54) MULTI-LAYER FLEXIBLE PRINTED CIRCUIT BOARD AND METHOD FOR MANUFACTURING THE SAME

(75) Inventor: Hyung Wook Lee, Siheung-si (KR)

(73) Assignee: LG Innotek Co., Ltd., Seoul (KR)

( * ) Notice: Subject to any disclaimer, the term of this patent is extended or adjusted under 35 U.S.C. 154(b) by 11 days.

(21) Appl. No.: 11/910,142

(22) PCT Filed: Feb. 14, 2007

(86) PCT No.: PCT/KR2007/000792
§ 371 (c)(1),
(2), (4) Date: Sep. 28, 2007

(87) PCT Pub. No.: WO2007/094614
PCT Pub. Date: Aug. 23, 2007

(65) Prior Publication Data
US 2008/0289861 A1 Nov. 27, 2008

(30) Foreign Application Priority Data
Feb. 14, 2006 (KR) .................. 10-2006-0014093

(51) Int. Cl.
*H05K 1/00* (2006.01)

(52) U.S. Cl. ........................... 174/254; 174/260

(58) Field of Classification Search ................ 174/254, 174/260; 361/760
See application file for complete search history.

(56) References Cited

U.S. PATENT DOCUMENTS

| | | | |
|---|---|---|---|
| 5,589,251 A * | 12/1996 | Imaichi et al. | 428/209 |
| 5,603,158 A | 2/1997 | Murata et al. | |
| 6,602,584 B2 * | 8/2003 | Jo et al. | 428/209 |
| 6,620,513 B2 | 9/2003 | Yuyama et al. | |
| 6,902,949 B2 * | 6/2005 | Yamazaki et al. | 438/106 |
| 2005/0104214 A1 * | 5/2005 | Maeda et al. | 257/747 |
| 2009/0038839 A1 * | 2/2009 | Hashimoto et al. | 174/350 |
| 2009/0095517 A1 * | 4/2009 | Nonaka et al. | 174/259 |
| 2009/0178834 A1 * | 7/2009 | Akutsu et al. | 174/260 |

FOREIGN PATENT DOCUMENTS

| | | |
|---|---|---|
| JP | 2-039489 A | 2/1990 |
| JP | 4-334088 A | 11/1992 |
| JP | 8-104859 A | 4/1996 |
| JP | 2002-314207 A | 10/2002 |

* cited by examiner

*Primary Examiner* — Yuriy Semenenko
(74) *Attorney, Agent, or Firm* — Saliwanchik, Lloyd & Eisenschenk

(57) ABSTRACT

Disclosed are a multi-layer flexible printed circuit board and a method for manufacturing the same. The multi-layer flexible printed circuit board includes an adhesion sheet from which a pressing and heating area is cut, an upper base layer, from which the pressing and heating area is cut, on the adhesion sheet, and a lower base layer under to the adhesion sheet.

20 Claims, 3 Drawing Sheets

[Fig. 1] Prior Art
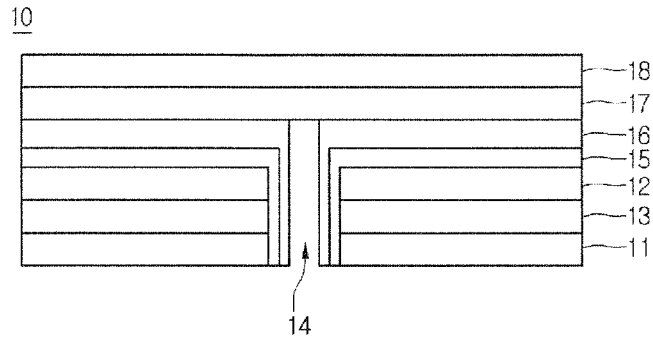
[Fig. 2]
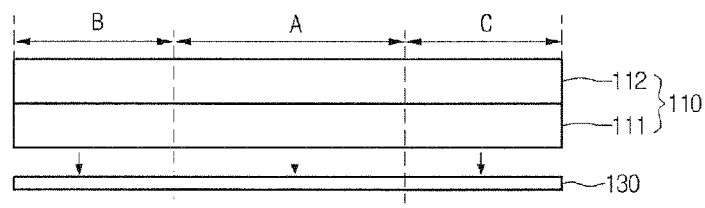
[Fig. 3]
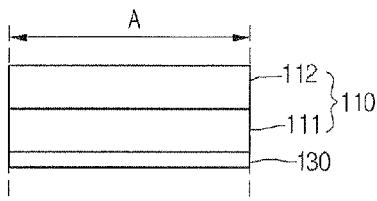
[Fig. 4]
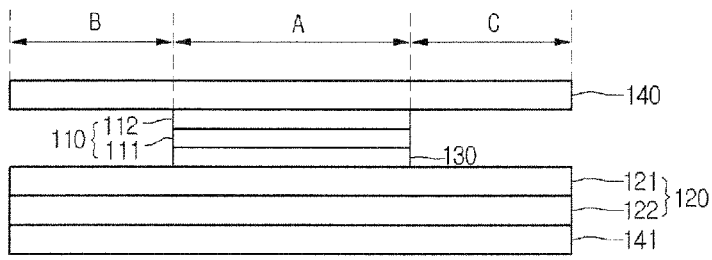
[Fig. 5]
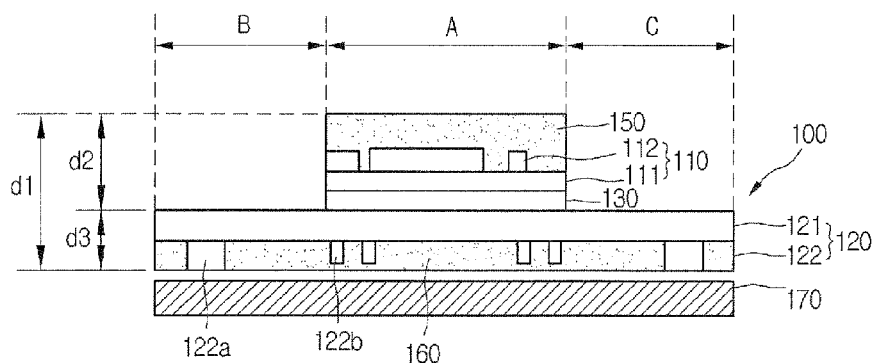

[Fig. 6]
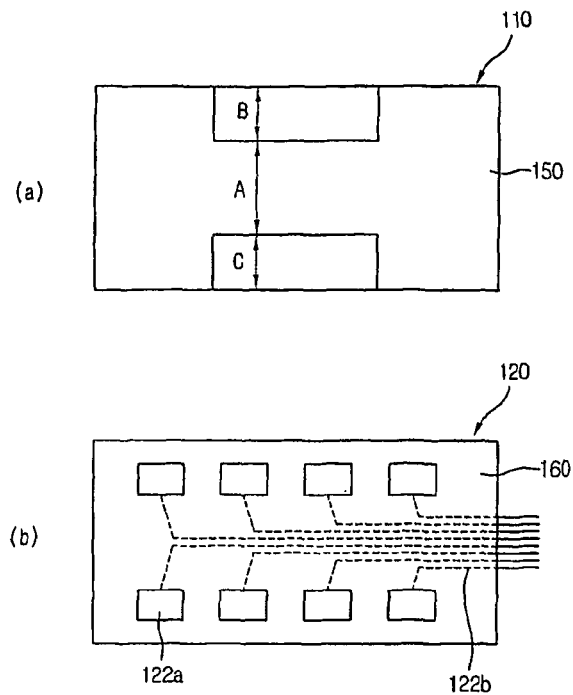
[Fig. 7]
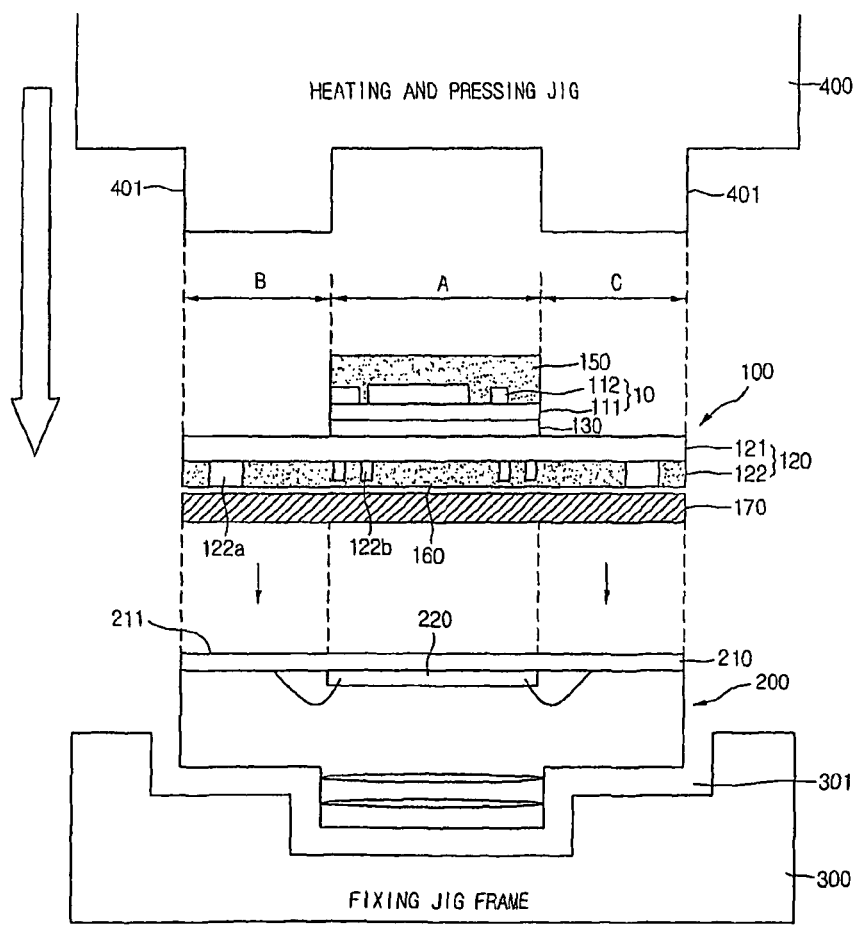

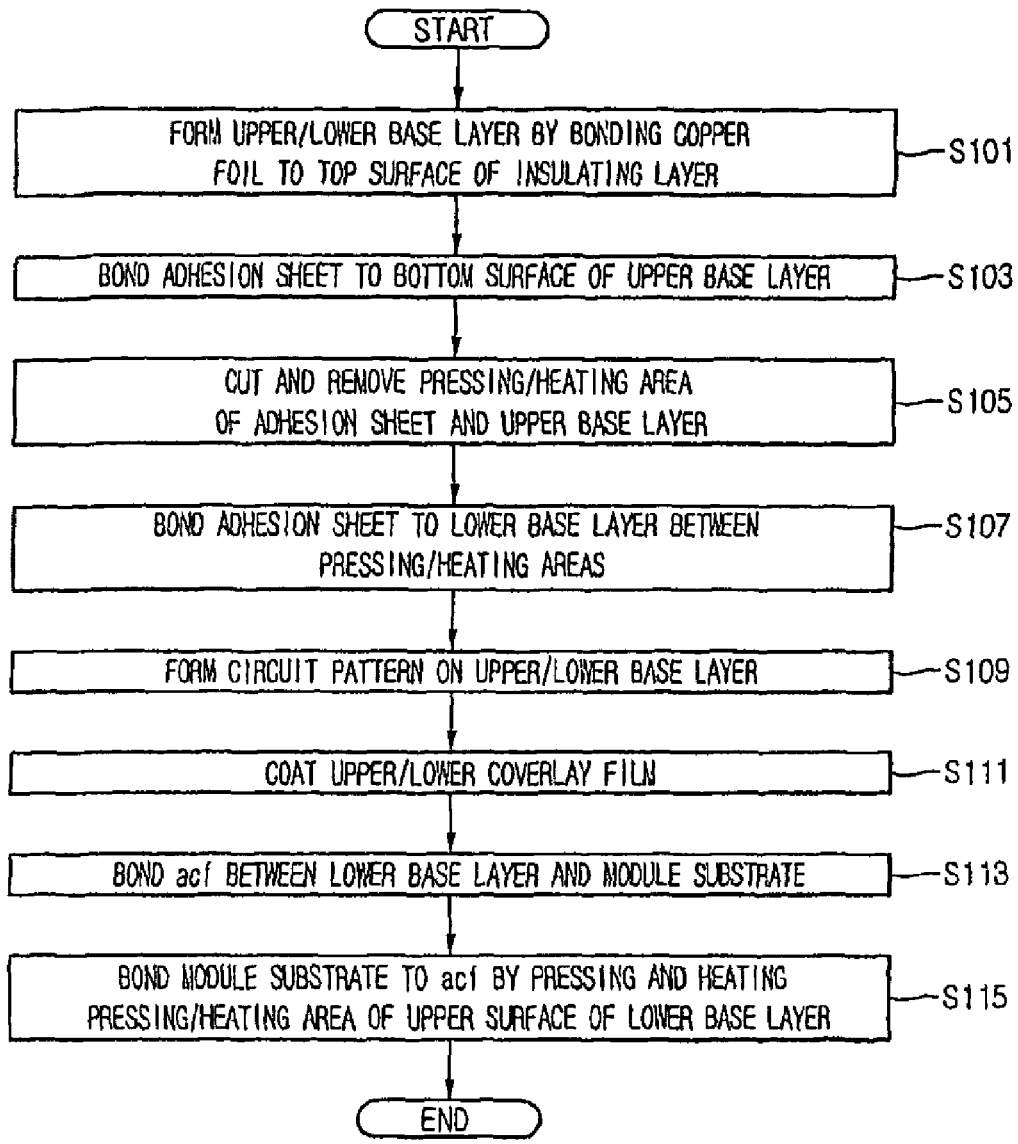
[Fig. 8]

MULTI-LAYER FLEXIBLE PRINTED CIRCUIT BOARD AND METHOD FOR MANUFACTURING THE SAME

Cross-Reference to Related Application

This application is the U.S. national stage application of International Patent Application No. PCT/KR2007/000792, filed Feb. 14, 2007, the disclosure of which is hereby incorporated by reference in its entirety.

TECHNICAL FIELD

The present invention relates to a multi-layer flexible printed circuit board and a method for manufacturing the same.

BACKGROUND ART

Recently, as electronic parts and component embedding technologies have been developed, and electronic appliances have become gradually light, compact, and slim, the demand of a multi-layer flexible printed circuit board (FPCB) is steadily growing.

The multi-layer FPCB has strong heat-resistant, bending-resistant, and medicine-resistant characteristics, enables high-concentration interconnections, and is easily assembled with a device, so the multi-layer FPCB is widely used for cameras, computers, peripheral devices of the computers, mobile communication terminals, video and audio appliances, liquid crystal displays, satellite devices, medial devices, etc.

In general, in order to manufacture the multi-layer FPCB, a dry film is laminated on a copper foil laminated film including a copper foil on a base film, and a predetermined circuit pattern is formed on the dry film through exposure, development, and etching processes. After that, a coverlay film is bonded to the resultant structure.

FIG. 1 is a sectional view showing the structure of the conventional multi-layer FPCB 10.

Referring to FIG. 1, the multi-layer FPCB 10 includes a base film 11, a copper foil layer 12, a via hole 14, plating layers 15 and 16, and an upper film 18.

The base film 11 includes a polyimide film. After gluing the copper foil layer 12 to the upper surface of the base film 11 by an adhesive agent 13, a dry film is laminated on the copper foil layer 12, and then, and exposure, development, and etching processes are performed, thereby forming a predetermined circuit pattern.

After forming the via hole 14 in the base film 11 and the copper foil layer 12, an electroless copper plating layer 15 is formed in the via hole 14 and top surface of the copper foil layer 12 and the via hole 14, and an electrolytic copper plating layer 16 is formed in the via hole 14 and top surface of the electroless copper plating layer and the via hole 14.

The upper film 18 including polyimide adheres to the top surface of the electrolytic copper plating layer 16 by the adhesive 17.

An anisotropic conductive film (ACF) is fusion-welded on the top surface of the upper film 18 of the FPCB formed through the above-described manufacturing process, so that various kinds of electronic appliances are electrically connected to the upper film 18. The ACF includes a conductive adhesive layer having the shape of a thin film formed by mixing minute particle type conductive particles such as metal-coated plastic particles and metal particles, adhesive agents, and additives with each other.

Such an ACF is thin fusion-welded on the top surface of the upper film 18, pressed with a high temperature, and then bonded to the terminals of the electronic appliances, thereby protecting the conductive particles distributed in the ACF between the top surface of the upper film 18 and the terminals of the electronic appliances so as to obtain conductivity. In addition, since the top surface of the upper film 18 and the terminals of the electronic appliances, which are adjacent to each other, are filled with adhesive agents, the conductive particles independently exist. Accordingly, a high insulating characteristic can be obtained.

However, when the FPCB is connected to electronic appliances such as camera modules by using the ACF, the thickness of the FPCB and the ACF makes it difficult to perform the thin bonding between the FPCB and the electronic appliances. In addition, since a heating temperature, a pressing pressure, and a bonding time interval increase proportionally to the thickness of the FPCB, a bad influence may be exerted on the camera module. Accordingly, the defect rate of the camera modules may increase.

DISCLOSURE OF INVENTION

Technical Problem

An embodiment of the present invention provides a multi-layer FPCB and a method for manufacturing the same.

An embodiment of the present invention provides a multi-layer FPCB and a method for manufacturing the same, capable of realizing a thin multi-layer FPCB by removing pressing/heating areas of an upper base layer and an adhesion sheet.

An embodiment of the present invention provides a multi-layer FPCB and a method for manufacturing the same, capable of reducing pressing pressure, pressing temperature, and bonding time of the multi-layer FPCB from which a portion of a pressing/heating area is removed.

Technical Solution

An embodiment of the present invention provides a multi-layer flexible printed circuit board comprising an adhesion sheet from which a pressing and heating area is cut, an upper base layer, from which the pressing and heating area is cut, on the adhesion sheet, and a lower base layer under the adhesion sheet.

An embodiment of the present invention provides a method for manufacturing a multi-layer flexible printed circuit board, the method comprising the steps of gluing an upper base layer on an adhesion sheet, removing a pressing and heating area from the adhesion sheet and the upper base layer, gluing the adhesion sheet to a lower base layer, and forming predetermined circuit patterns on the upper and lower base layers.

ADVANTAGEOUS EFFECTS

According to one embodiment of the present invention, a pressing/heating area of a multi-layer FPCB can be formed more thin as compared with that of the conventional multi-layer FPCB, so that heat conduction efficiency can be improved.

In addition, when the multi-layer FPCB is bonded to a target module, required pressing time can be reduced by 40% as compared with the pressing time of the conventional FPCB.

Further, the defect rate of the target module bonded to the multi-layer FPCB can be reduced.

BRIEF DESCRIPTION OF THE DRAWINGS

FIG. 1 is a sectional view showing the structure of a conventional FPCB;

FIG. 2 is a sectional view showing according to an embodiment of the present invention;

FIG. 3 is an assembled sectional view showing an upper base layer bonded to an adhesion sheet in a multi-layer FPCB according to an embodiment of the present invention;

FIG. 4 is an assembled sectional view showing an upper base layer bonded to a lower base layer in a multi-layer FPCB according to an embodiment of the present invention;

FIG. 5 is a sectional view showing the structure of a multi-layer FPCB according to an embodiment of the present invention;

FIGS. 6A and 6B are front and rear views of the multi-layer FPCB according to an embodiment of the present invention;

FIG. 7 is a view showing an example of mounting the multi-layer FPCB shown in FIG. 5 on a camera module; and FIG. 8 is a flowchart showing manufacturing and bonding procedures of the multi-layer FPCB according to an embodiment of the present invention.

BEST MODE FOR CARRYING OUT THE INVENTION

It will be understood that when an element is referred to as being 'on' or "under" a layer, it can be directly on/under the layer, and one or more intervening layers may also be present.

Hereinafter, a multi-layer FPCB according to an embodiment of the present invention will be described with reference to accompanying drawings.

FIGS. 2 to 5 are views showing a manufacturing procedure of a multi-layer FPCB according to an embodiment of the present invention.

Referring to FIGS. 2 and 3, an upper base layer 110 includes a first insulating layer 111 and a first copper foil layer 112. The first insulating layer 111 includes insulating materials such as a flame retardant type 4 (FR-4) and a polyimide film, and the first copper foil layer 112 is bonded to a top surface of the first insulating layer 111 by an adhesive agent.

The upper base layer 110 is divided into a pattern forming area A and pressing/heating areas B and C. The pattern forming area A is used for forming a micro-circuit pattern (e.g., a ground pattern), and the pressing/heating areas B and C are pressed and heated for bonding with an anisotropic conductive film (ACF).

The first insulating layer 111 of the upper base layer 110 adheres to the top surface of an adhesion sheet 130. The adhesion sheet 130 includes resin such as prepreg or a bonding sheet.

As shown in FIG. 3, if the upper base layer 110 is bonded to the adhesion sheet 130, the pattern forming area A of the upper base layer 110 and the adhesion sheet 130 remains, and the pressing/heating areas B and C are cut and removed.

Then, as shown in FIG. 4, a lower base layer 120 adheres to a bottom surface of the adhesion sheet 130. The pressing/heating areas correspond to both portions of the top surface of the lower base layer 120, to which the adhesion sheet 130 is not adhesive.

The lower base layer 120 includes a second insulating layer 121 and a second copper foil layer 122. The second insulating layer 121 includes insulating materials such as FR-4 or a polyimide film and adheres to the adhesion sheet 130. The second copper foil layer 122 adheres to the bottom surface of the second insulating layer 121 in order to realize a micro-circuit pattern.

The top surface of the adhesion sheet 130 adheres to the upper base layer 110 from which a portion of the pressing/heating areas B and C are removed, and the bottom surface of the adhesion sheet 130 adheres to the lower base layer 120 having a portion of the pressing/heat areas B and C. The pressing/heat areas have widths corresponding to a pressing part of a heating/pressing jig.

Thereafter, an upper dry film 140, which is etching resist having a photoresist characteristic, is laminated on the upper part of the first copper foil layer 112, and a lower dry film 141 is laminated on the lower part of the second copper foil layer 122.

If the upper and lower dry films 140 and 141 are laminated on the first and second copper foil layers 112 and 122, after exposing and developing the resultant structure by a stepper and a developing solution, respectively, the first and second copper foil layers 112 and 122 are etched by an etching solution so as to remove the upper and lower dry films 140 and 141 from the resultant structure, thereby forming a circuit pattern on the first and second copper foil layers 112 and 122. The first copper foil layer 112 includes a ground pattern.

In addition, a via hole is formed by using an NC drill or a laser drill in order to electrically connect the first copper foil layer 112 to the second copper foil layer 122, electroless and electrolytic copper plating processes are performed in the via hole, so that copper plating layers may be formed on the first and second copper foil layers 112 and 122 and the surface of the via hole.

As shown in FIG. 5, upper/lower coverlay films 150 and 160 are coated on the first and second copper foil layers 112 and 122. The upper/lower coverlay films 150 and 160 include polyimide films and adhesive agents, cover the circuit patterns of the copper foil layers 112 and 122, and electrically disconnect the circuit patterns to each other. For example, the upper and lower coverlay films 150 and 160 may be coated by the thickness of 1 μm through a chemical vapor deposition (CVD) scheme or a langmuir-Blodgett (LB) scheme.

In this case, the upper coverlay film 150 can be coated on the first copper foil layer 112. At this time, the upper coverlay film 150 is also filled in etched portions of the first copper foil layer 112. The lower coverlay film 160 is coated on the second copper foil layer 122 except for window areas 122a, which are openings of the circuit pattern on the bottom surface of the second copper foil layer 122, and line patterns 122b in order to electrically disconnect circuit patterns to each other. The upper and lower coverlay films 150 and 160 may not be coated.

Then, a planarization process may be additionally performed in order to planarize the surfaces of the upper and lower coverlay films 150 and 160. Thus, the multi-layer FPCB 100 is completed through the above-described procedures. According to the present invention, the upper base layer 110 and the upper coverlay film 150, which are bonded to the top surface of the adhesion sheet 130, may be stacked in a multi-layer structure.

The multi-layer FPCB 100 has a thickness of d1, and a predetermined portion of the pressing/heating areas B and C has been removed by the thickness d2, so that the thickness of the pressing/heating areas B and C correspond to the thickness of d3. In other words, since the pressing/heating areas B and C of the adhesion sheet and the upper base layer are removed, the thickness d3 of the lower base layer becomes the thickness of the pressing/heating areas B and C. Accordingly, the thickness of the pressing/heating areas B and C becomes less than a half of the thickness of the conventional pressing/heating areas.

An anisotropic conductive film 170, which is an anisotropic conductive adhesive agent, is bonded to the bottom surface of the second copper foil layer 122 and the lower coverlay film 160 of the multi-layer FPCB 100. In this case, the anisotropic conductive film 170 is bonded to the bottom surface of the second copper foil layer 122 and the lower coverlay film 160 such that the multi-layer FPCB 100 is electrically connected to the substrate of the target module. For example, the target module includes a camera module embedded in a portable terminal.

FIGS. 6A and 6B are a front view and a rear view showing the multi-layer FPCB according to one embodiment of the present invention.

As shown in FIG. 6A, predetermined portions of the pressing/heating areas B and C having a predetermined size are removed from both sides of the upper base layer 110, and the upper coverlay film 150 is coated between circuit patterns and on the surface of the upper base layer 110 except for the predetermined portions of the pressing/heating areas B and C.

As shown in FIG. 6B, the lower base layer 120 has exposed window areas 122a, which are openings of a circuit pattern, and line patterns 122b. The lower coverlay film 160 is coated on the bottom surface of the lower base layer 120 except for the window areas 122a. At this time, the coating height of the lower coverlay film 160 is equal to or slightly lower than the height of the window area 122a.

FIG. 7 is a view showing an example of mounting the multi-layer FPCB shown in FIG. 5 on a camera module 200.

Referring to FIG. 7, the camera module 200 is mounted on an internal mounting part 301 of a fixing jig frame 300. In the camera module 200, an image sensor 220 is connected to the inside of a substrate 210. The image sensor 220 includes a CMOS or a CCD. In this case, the image sensor 220 may be not overlapped with pressing/heating areas.

The anisotropic conductive film (ACF) 170 adheres between the substrate 210 of the camera module 200 and the multi-layer FPCB 100. In this case, after the anisotropic conductive film (ACF) 170 adheres to the lower part of the multi-layer FPCB 100, the anisotropic conductive film (ACF) 170 may adhere to the substrate 210 of the camera module 200.

Then, a heating/pressing jig 400 is driven so that a pressing part 401 sticks to the pressing/heating areas B and C of the insulating layer 121 of the lower base layer 120. Then, the pressing/heating areas B and C are heated and pressed through the pressing part 401 with a predetermined temperature and a predetermined pressure for a bonding time interval. Accordingly, the second copper foil layer 122 of the lower base layer 120 is bonded to a rear surface 211 of a substrate 210, so that the circuit pattern of the second copper foil layer 122 is electrically connected to a circuit pattern of the rear surface 211.

In this case, since the heating/pressing jig 400 heats and presses the thin pressing/heating areas B and C of the multi-layer FPCB 100, a pressure transfer rate and a heat transfer rate are enhanced as compared with the pressure transfer rate and the heat transfer rate according to the conventional technology. In other words, the heat transfer rate can be improved by 40% as compared with a heat transfer rate according to the conventional technology. In addition, although the pressing/heating areas B and C are pressed and heated with a temperature according to the conventional technology, the bonding time interval can be reduced by 40% as compared with that of the conventional technology. For example, although a substrate is heated with a temperature of 200° C. for a bonding time interval of 7 seconds according to the conventional technology, the substrate can be bonded with a heating temperature of 200° C. for a bonding time interval of 4.2 seconds according to the present invention.

In this case, a predetermined air gap (not shown) is provided between the upper coverlay film 150 of the pattern forming area A and the heating/pressing jig 400 so as to prevent the shock according to heating/pressing.

In addition, the first and second insulating layers 111 and 121, and the upper and lower coverlay films 150 and 160 absorb pressure transferred to the image sensor 220 of the camera module 200 when the pressure of the heating/pressing jig 400 is transferred, thereby reducing the shock according to the pressure transfer.

FIG. 8 is a flowchart showing manufacturing and installing procedures of a multi-layer FPCB according to an embodiment of the present invention.

Referring to FIG. 8, a copper foil layer is bonded to the top surface of an insulating layer so as to form an upper/lower base layer (step S101).

Then, an adhesion sheet is bonded to a bottom surface of the upper base layer (step S103), and portions of the pressing/heating areas of the adhesion sheet and the upper base layer are cut and removed (step S105). The bottom surface of the adhesion sheet is bonded to the lower base layer between pressing/heating areas (step S107).

A circuit pattern is formed on a copper foil layer of the upper/lower base layer (step S109). The upper/lower coverlay film is coated on the copper foil layer of the upper/lower base layer in order to protect the circuit pattern of the copper foil layer of the upper/lower base layer (step S111). Through the procedure, the multi-layer FPCB is completed.

An ACF is glued between the lower base layer and a module substrate of the multi-layer FPCB (step S113), and the ACF is bonded to the module substrate by pressing and heating the pressing/heating area of the lower base layer using the heating/pressing jig (step S115).

Although the spirit of the present invention is described in detail according to preferred embodiments of the present invention, the embodiments are only for the purpose of description, and the present invention is not limited thereto. In addition, those skilled in the art will appreciate that various modifications, additions and substitutions are possible, without departing from the scope and spirit of the invention as disclosed in the accompanying claims.

INDUSTRIAL APPLICABILITY

According to the present invention, a pressing/heating area of a multi-layer FPCB is formed more thin as compared with that of the conventional multi-layer, so that heat conduction efficiency can be improved.

In addition, when the multi-layer FPCB is bonded to a substrate of a target module, a required pressing time interval can be reduced by 40% as compared with of that of the conventional multi-layer FPCB.

Further, the defect rate of the target module according to a bonding process of the multi-layer FPCB can be reduced.

The invention claimed is:

1. A multi-layer flexible printed circuit board comprising:
   an adhesion sheet from which a pressing and heating region is cut;
   an upper base layer, from which the pressing and heating region is cut, on the adhesion sheet; and
   a lower base layer under the adhesion sheet and extending past the region of the adhesion sheet from which the pressing and heating region is cut, wherein the lower base layer directly contacts an entire lower surface of the adhesion sheet,
wherein the lower base layer includes a first region, a second region, and a third region, wherein the first region and the third region correspond to the pressing and heating region, wherein the adhesion sheet and the upper base layer are disposed on the second region between the first region and the third region.

2. The multi-layer flexible printed circuit board as claimed in claim 1, wherein the adhesion sheet comprises prepreg or a bonding sheet.

3. The multi-layer flexible printed circuit board as claimed in claim 1, wherein the upper base layer comprises a first insulating layer on the adhesion sheet and a first copper foil layer formed with a circuit pattern on the first insulating layer, and wherein the lower base layer comprises a second insulating layer under the adhesion sheet and a second copper foil layer formed with a circuit pattern under the second insulating layer.

4. The multi-layer flexible printed circuit board as claimed in claim 3, wherein the first insulating layer comprises a flame retardant type 4 (FR-4) or a polyimide film, and wherein the second insulating layer comprises a FR-4 or a polyimide film.

5. The multi-layer flexible printed circuit board as claimed in claim 3, comprising an upper coverlay film coated on the first copper foil layer.

6. The multi-layer flexible printed circuit board as claimed in claim 3, comprising a lower coverlay film coated on a lower surface of the second copper foil layer to disconnect circuit patterns from each other.

7. The multi-layer flexible printed circuit board as claimed in claim 1, wherein a pressing and heating region of the lower base layer corresponds to a pressing part of a heating/pressing jig.

8. The multi-layer flexible printed circuit board as claimed in claim 1, wherein a pressing and heating region of the lower base layer is located in a region that the adhesion sheet does not exist.

9. The multi-layer flexible printed circuit board as claimed in claim 1, wherein the lower base layer is bonded to a substrate of a target module using a conductive adhesion member.

10. The multi-layer flexible printed circuit board as claimed in claim 9, wherein the conductive adhesion member comprises an anisotropic conductive film (ACF).

11. The multi-layer flexible printed circuit board as claimed in claim 9, wherein the target module comprises a camera module of a portable terminal.

12. The multi-layer flexible printed circuit board as claimed in claim 1, wherein a thickness of the pressing and heating region of the lower base layer is equal to or less than a half of a thickness of the multi-layer flexible printed circuit board.

13. A multi-layer flexible printed circuit board comprising:
an adhesion sheet;
an upper base layer including a first insulating layer on the adhesion sheet and a first copper foil layer formed with a circuit pattern on the first insulating layer, wherein the first insulating layer is formed on an entire surface of the adhesion sheet; and
a lower base layer including a second insulating layer under the adhesion sheet and a second copper foil layer formed with a circuit pattern under the second insulating layer,
wherein a top surface of the lower base layer has an area greater than the area of a bottom surface of the adhesion sheet,
wherein the second insulating layer directly contacts an entire lower surface of the adhesion sheet,
wherein the top surface of the lower base layer includes a first region, a second region, and a third region, wherein the second region coincides with the area of the bottom surface of the adhesion sheet, and wherein the adhesion sheet and the upper base layer are disposed on the second region between the first region and the third region.

14. The multi-layer flexible printed circuit board as claimed in claim 13, wherein the adhesion sheet comprises prepreg or a bonding sheet.

15. The multi-layer flexible printed circuit board as claimed in claim 13, wherein the first insulating layer comprises a flame retardant type 4 (FR-4) or a polyimide film, and wherein the second insulating layer comprises a FR-4 or a polyimide film.

16. The multi-layer flexible printed circuit board as claimed in claim 13, comprising an upper coverlay film coated on the first copper foil layer.

17. The multi-layer flexible printed circuit board as claimed in claim 13, comprising a lower coverlay film coated on a lower surface of the second copper foil layer to disconnect circuit patterns from each other.

18. The multi-layer flexible printed circuit board as claimed in claim 13, wherein the lower base layer is bonded to a substrate of a target module using a conductive adhesion member.

19. The multi-layer flexible printed circuit board as claimed in claim 18, wherein the conductive adhesion member comprises an anisotropic conductive film (ACF).

20. The multi-layer flexible printed circuit board as claimed in claim 18, wherein the target module comprises a camera module of a portable terminal.

* * * * *